United States Patent [19]

Vaes et al.

[11] 4,422,089
[45] Dec. 20, 1983

[54] SEMICONDUCTOR DEVICE HAVING A REDUCED SURFACE FIELD STRENGTH

[75] Inventors: Henricus M. J. Vaes; Johannes A. Appels; Adrianus W. Ludikhuize, all of Eindhoven, Netherlands

[73] Assignee: U.S. Philips Corporation, New York, N.Y.

[21] Appl. No.: 219,160

[22] Filed: Dec. 22, 1980

[30] Foreign Application Priority Data

Sep. 8, 1980 [NL] Netherlands ............... 8005053

[51] Int. Cl.³ ............... H01L 29/76; H01L 29/78; H01L 29/72
[52] U.S. Cl. ............... 357/22; 357/13; 357/23; 357/35; 357/89
[58] Field of Search ............... 357/22, 89, 90, 22 R, 357/23 R, 23 HV, 13, 35

[56] References Cited

U.S. PATENT DOCUMENTS 4,233,617 11/1980 Klassen et al. ............... 357/23
4,292,642 9/1981 Appels et al. ............... 357/22

Primary Examiner—James W. Davie
Attorney, Agent, or Firm—Thomas A. Briody; Robert T. Mayer; Steven R. Biren

[57] ABSTRACT

A semiconductor device of the "RESURF" type has a substrate region and a superimposed semiconductor layer which forms a p-n junction with the substrate region. The semiconductor layer has an island-shaped region which is depleted at least locally up to the surface at a reverse voltage applied across the p-n junction which is well below the breakdown voltage of the p-n junction. According to the invention the island-shaped part of the semiconductor layer over at least a part of its area has a doping profile in the vertical direction with at least two overlying layer portions with different average net doping concentrations and of the same or opposite conductivity type, so as to increase the current-carrying capacity of the semiconductor layer.

21 Claims, 11 Drawing Figures

SEMICONDUCTOR DEVICE HAVING A REDUCED SURFACE FIELD STRENGTH

BACKGROUND OF THE INVENTION

The invention relates to a semiconductor device having a semiconductor body comprising a substrate region of a first conductivity type, a surface adjoining layer-shaped semiconductor region provided on said substrate region, at least a part of said layer-shaped semiconductor region being of the second conductivity type and forming a p-n junction with said substrate region, an island-shaped part of said layer-shaped semiconductor region being bounded laterally by a separation region which extends from the surface over substantially the whole thickness of the semiconductor region, at least one zone of a semiconductor circuit element being provided within said island-shaped part, in which the overall net doping of the second conductivity type of said layer-shaped semiconductor region in atoms per unit of surface area is so small that upon applying a voltage in the reverse direction across said p-n junction the depletion zone within the island-shaped part extends at least locally from said p-n junction up to the surface at a voltage which is lower than the breakdown voltage of the p-n junction.

The expression "doping of a given conductivity type" should be understood herein in the algebraic sense. For example, an n-type region has a positive n-type doping concentration but a negative p-type doping concentration.

It is furthermore to be noted that in the operating condition the same reverse voltage need not be present at any point across the said p-n junction, for example, as a result of currents flowing parallel to the surface. As a result of the voltage drop caused by such currents it may occur, for example, that the island-shaped region is depleted entirely up to the surface in places where the reverse voltage is high and is not fully depleted up to the surface in places where the reverse voltage is lower. It is essential that depletion should occur throughout the thickness of the island-shaped region in those places where the surface field strength is high.

Semiconductor devices of the kind described (so-called "RESURF" devices, "RESURF"="REduced SURface Field") are known from Philips Journal of Research, Volume 35, No. 1, 1980, pp. 1 to 13. Such devices are also described in the Dutch Patent Applications Nos. 7800582, 7807834 and 7807835 of Applicants open to public inspection and corresponding to U.S. Pat. Nos. 4,233,617 and 4,292,642, which are hereby incorporated in this Application by reference. In these known devices the layer-shaped semiconductor region is doped substantially homogeneously.

As is explained in the cited Philips Journal of Research publication, the breakdown voltage of p-n junctions in semiconductor devices of the kind described may be very high and may closely approach or may even equal the unidimensionally computed value (at which the p-n junction is considered to be flat and infinitely extended). This is a result of the fact that, at high reverse voltage across the p-n junction, the field strength at the surface is considerably reduced by the complete depletion of the layer-shaped region.

Since the net doping of the layer-shaped region must be comparatively small, however, such semiconductor devices have a rather low current-carrying capacity via the homogeneously doped layer-shaped region. An increase of the doping concentration cannot provide a solution in this case since then even at high voltage the layer-shaped region can no longer be depleted entirely, so that the breakdown voltage of the p-n junction would be reduced.

Another disadvantage of the known device described above is that, when an active zone of the first conductivity type is present in the island-shaped region (for example, the base zone of a transistor), expansion of the depletion zone from the substrate region up to said active zone ("punch-through") can occur in certain circumstances. This applies in particular to the use in emitter follower applications.

In addition, the known devices described are often difficult to manufacture in a reproducible manner, since variations in the thickness and the doping of an epitaxial layer easily occur and may have an important influence on the electric characteristics.

SUMMARY OF THE INVENTION

One of the objects of the invention is to avoid or at least considerably mitigate the disadvantages occurring in known devices.

A particular object of the invention is to provide a semiconductor device of the kind described in which the resistance to currents occurring in the device and flowing parallel to the surface through the layer-shaped region is considerably reduced as compared with that in a "RESURF" device of known structure, and in which the possibility of "punch-through" is reduced.

The invention is based inter alia on the recognition of the fact that this object can be achieved by using an adequate doping profile in the thickness direction of the layer-shaped region.

According to the invention, a semiconductor device of the kind described above is characterized in that at least said island-shaped part of the layer-shaped semiconductor region over at least a part of its area has, in a direction perpendicular to the surface, a doping profile comprising at least two overlying layer portions of different average net doping concentration.

By using the invention it is possible when lateral currents occur in the device, to provide the greater part of the overall doping in the layer portion which passes these currents and thus to reduce the electric resistance considerably, while nevertheless the overall net doping is so low that complete depletion of the layer-shaped region can be achieved at a reverse voltage across the p-n junction which is amply below its breakdown voltage.

Furthermore, when using the invention, the above-described possibility of "punch-through" from the substrate region can be avoided by giving the layer portion adjoining the substrate region a higher average doping concentration than the remaining part of the layer-shaped region.

According to the simplest embodiment, the layer-shaped semiconductor region is entirely of the second conductivity type, from the substrate region up to the surface.

A very important further preferred embodiment is characterized in that the layer-shaped semiconductor region comprises at least a first layer portion of the second conductivity type adjoining the substrate region and at least a second layer portion of the first conductivity type present thereon, the last, surface-adjoining layer portion in itself having such a low doping as to be fully depleted at a voltage across the p-n junction which is lower than the breakdown voltage, the layer portions of the first conductivity type being connected to a potential which is substantially equal to the potential of the substrate region. As a result of this, the average doping concentration of the layer portion adjoining the substrate region may be chosen to be still higher than in the case of a layer-shaped region which has only one conductivity type from the substrate region up to the surface. This is caused by the fact that at least one of the layer portions is depleted from at least two sides since it is present between two parallel p-n junctions or p-n junction parts. This embodiment can be extended to a layer-shaped semiconductor region consisting of several successive layer portions of alternate conductivity types present one on top of the other in which the layer portions of the second conductivity type are mutually connected to substantially the same potential, for example, via a semiconductor zone. The above-mentioned "last" layer portion is to be understood to mean herein the layer portion between the last p-n junction and the surface.

A simple manner of connecting the layer portions of the first conductivity type to substantially the same potential as the substrate region is to ensure that said layer portions are connected to the substrate region by means of semiconductor zones of the first conductivity type (for example, the above-mentioned separation region). Other means, however, may also be used. "Substantially the same potential" is to be understood to mean in this connection a potential difference of at most a few p-n junction diffusion voltages (a few volts).

For certain applications, when the layer-shaped region consists of a first layer portion of the second conductivity type adjoining the substrate and a surface-adjoining second layer portion of the first conductivity type present thereon, it may be advantageous for the second layer portion to be locally interrupted.

In particular, in those devices in which high surface field strengths occur at the edge of the island-shaped region it is advantageous for the layer portions with different net doping concentrations to extend up to the edge of the island-shaped region.

As in most "RESURF" devices, the invention is most of interest in the case in which the doping concentration of at least the part of the second conductivity type of the layer-shaped region adjoining the substrate region is higher than that of the substrate region.

BRIEF DESCRIPTION OF THE DRAWING

The invention will now be described in greater detail with reference to the drawing, in which.

DETAILED DESCRIPTION

Figure 1:
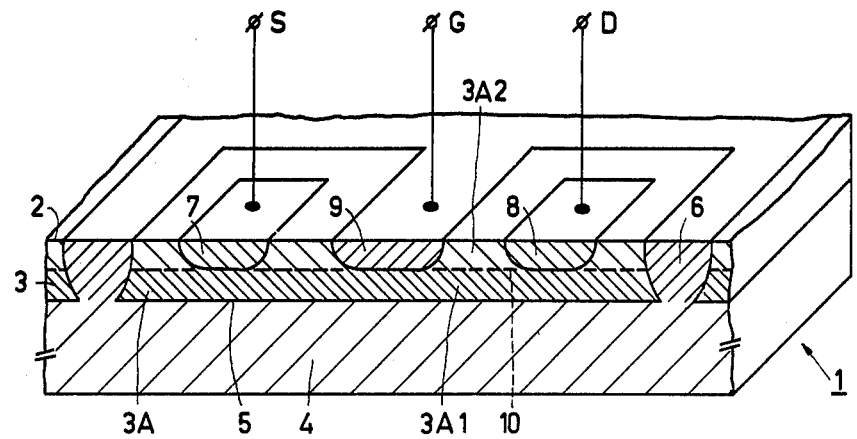
FIG. 1 is partly a perspective view and partly a diagrammatic cross-sectional view of a device according to the invention.

The figures are schematic and not drawn to scale. Corresponding parts are generally referred to by the same reference numerals. Semiconductor regions of the same conductivity type are shaded in the same direction.

In FIGS. 1, 3, 4, 6, 8 and 9, the oxide layer on the surface in which the contact windows are provided is omitted for simplicity.

FIG. 1 is partly a perspective view and partly a cross-sectional view of a semiconductor device according to the invention. The semiconductor body 1, in this example of silicon, comprises a substrate region 4 of a first conductivity type, in this case the p-conductivity type, and a layer-shaped semiconductor region 3 present thereon and adjoining a surface 2. Of the layer-shaped region 3, at least the part adjoining the substrate region 4 is n-type conductive and in this example is also more highly doped than the substrate region which has a doping concentration of approximately $4.5 \times 10^{14}$ atoms per $cm^3$ (resistivity approximately 30 Ohm.cm). In this example the whole layer-shaped region 3 is n-type conductive; it forms a p-n junction 5 with the substrate region 4.

An island-shaped part 3A of the layer-shaped semiconductor region 3 is bounded laterally by a separation region 6 which in this example is formed by a p-type semiconductor zone extending from the surface 2 throughout the thickness of the layer-shaped region 3.

A semiconductor circuit element, in this case a junction field effect transistor (JFET) having n-type source and drain zones 7 and 8 and a p-type gate electrode zone 9 is provided within the island-shaped region. The overall n-type net doping of the layer-shaped semiconductor region 3, that is to say the overall number of donor atoms minus the overall number of acceptor atoms per unit of surface area throughout the thickness of the region 3, is so small that upon applying a voltage in the reverse direction across the p-n junction 5, the depletion zone extends over the whole thickness of the region 3, from the substrate 4 up to the surface 2, at a voltage which is lower than the breakdown voltage. In the present case said net doping is approximately $1.2 \times 10^{12}$ atoms per $cm^2$. As a result of this, with high reverse voltage across the p-n junction 5 the field strength at the surface 2 is considerably reduced, as is amply explained in the above-mentioned publications. Thus, very high values for the breakdown voltage of the p-n junctions 5 can be realized, the breakdown voltage of the p-n junction being determined substantially by the substrate doping and not by the surface breakdown at the edge of the p-n junction between the separation region 6 and the region 3A.

When the region 3 has a homogeneous doping, the resistivity will be comparatively high as a result of the depletion condition. In this example the overall thickness of region 3 is approximately 2.5 μm, which, with an overall doping of $1.2 \times 10^{12}$ atoms per $cm^2$ in the case of homogeneous doping would yield a doping concentration of $4.8 \times 10^{15}$ atoms per cm$^3$ corresponding to a resistivity of approximately 1.2 ohm.cm.

Such a high resistivity can cause an undesirably high series resistance in the channel region between the gate electrode zone 9 and the substrate region 4 in the conductive condition of the field effect transistor.

In order to avoid or at least considerably reduce this disadvantage, according to the invention the region 3 is not doped homogeneously. The region 3 can be divided in two superimposed layer portions 3A1 and 3A2 which are separated by the broken line 10, see FIG. 1, portion 3A1 having a higher average doping concentration that portion 3A2. The island-shaped region 3A thus has a nonhomogenous doping profile in a direction perpendicular to the surface. In this example the layer portion 3A1 has a thickness of 1.4 $\mu$m, the layer portion 3A2 has a thickness of 1.1 $\mu$m. The average doping concentration of the layer portion 3A1 is $7.2 \times 10^{15}$ atoms per cm$^3$ (overall doping $10^{12}$ atoms per cm$^2$), that of the layer portion 3A2 is $1.8 \times 10^{15}$ atoms per cm$^3$ (overall doping $2.10^{11}$ atoms per cm$^2$). Thus, the overall net doping is $1.2 \times 10^{12}$ atoms per cm$^2$, but the average doping concentration of the layer portion 3A1 is considerably higher than would be the case with a homogeneous doping. By thus concentrating the greater part of the overall doping in the layer portion 3A1 where the current flows between the source and drain electrode, the series resistance is considerably reduced.

The nonhomogeneous doping concentration can be realized by means of various known technologies. According to a first embodiment, the layer portions 3A1 and 3A2 can each be formed by an epitaxially grown layer. According to a second embodiment the nonhomogeneous doping of the layer-shaped region 3 can be obtained by ion implantation, either by means of a single implantation in which the maximum concentration is at some distance below the surface, or by means of successive implantation steps. Furthermore, combinations of, for example, an arsenic-implanted layer portion 3A1 having thereon an epitaxially grown lower-doped layer portion 3A2 may also be used. If desired, diffusion methods may also be used. The manner in which the desired nonhomogeneous doping profile is realized is not of importance for the invention and those skilled in the art can make a suitable choice from the known available methods.

In this example, the layer portion 3A1 is obtained by implanting arsenic ions in the substrate followed by the usual heating step to activate the arsenic ions and to eliminate crystal damage. The 1.1 $\mu$m thick n-type silicon layer 3A2 is then deposited epitaxially on the resulting implanted surface layer while using conventional epitaxial growth methods. Also in a usual manner the p+ separation diffusion 6 is then provided and the p-type gate electrode zone 9 and the n-type source and drain zones 7 and 8 are then provided in separate diffusion steps, all of them down to a depth of approximately 1.1 $\mu$m.

Although for simplicity FIG. 1 has been drawn symmetrically, in order to save space the distance between the gate electrode zone 9 and the source zone 7 was smaller than that between the gate electrode zone and the drain zone 8 which was at a high positive voltage. Viewed in the direction from the source zone to the drain zone, the distance between the separation zone 6 and the source zone 7 was approximately 10 $\mu$m, the distance between the source zone 7 and the gate electrode 9 was 5 $\mu$m, the distance between the gate electrode zone and the drain zone 8 was 30 $\mu$m and that between the drain zone 8 and the separation zone 6 was also 30 $\mu$m. The dimension of the source and drain zones 7 and 8 and of the gate electrode 9 in the direction from source zone to drain zone was 10 $\mu$m.

Figure 2:
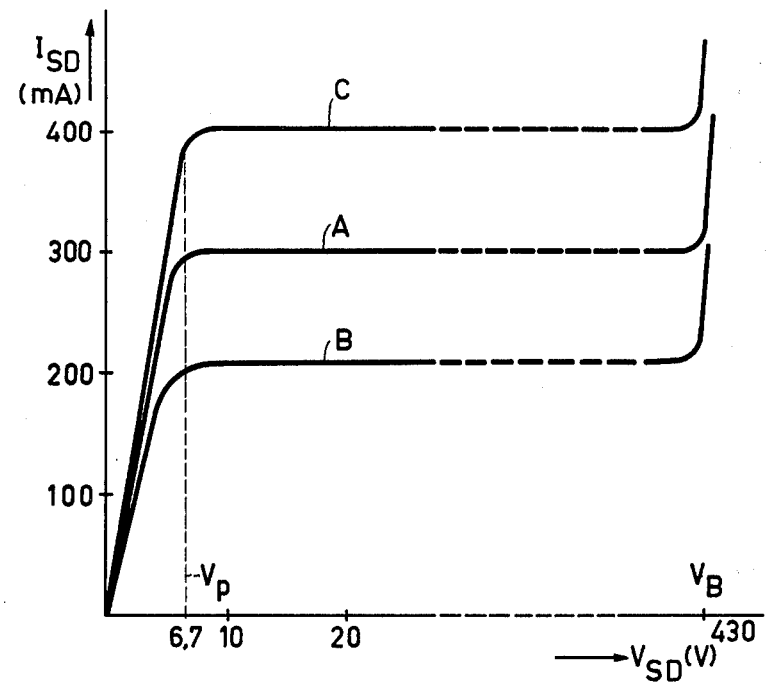
FIG. 2 shows electrical characteristics of devices according to the invention as compared with the prior art.

FIG. 2 shows the drain current as a function of the voltage between the source and drain zones at a gate voltage of zero volts. Curve A shows the characteristic for the field effect transistor of FIG. 1. The pinch off voltage Vp is 6.7 volts. Curve B shows the same characteristic for a field effect transistor having the same dimensions and pinch off voltage but having a homogeneously doped layer-shaped region 3 with an overall doping $1.2 \times 10^{12}$ atoms per cm$^2$. So it is found that by using a doping profile according to the invention the saturation current rises from 210 mA to 300 mA with the thickness of the layer-shaped region 3 remaining the same. The source-drain breakdown voltage is in both cases approximately 430 volts, and approaches the unidimensionally-computed theoretical breakdown voltage of 450 volts as a result of the fact that the layer-shaped region 3 is entirely depleted well before reaching said breakdown voltage.

Although in the embodiment described an epitaxial layer 3A2 is used, local variations of the doping and the thickness of said layer have comparatively less influence on the characteristics (pinch off voltage, saturation current) than in the case of a homogeneously doped epitaxial layer-shaped region, since the doping is concentrated mainly in the implanted layer 3A1.

Figure 3:
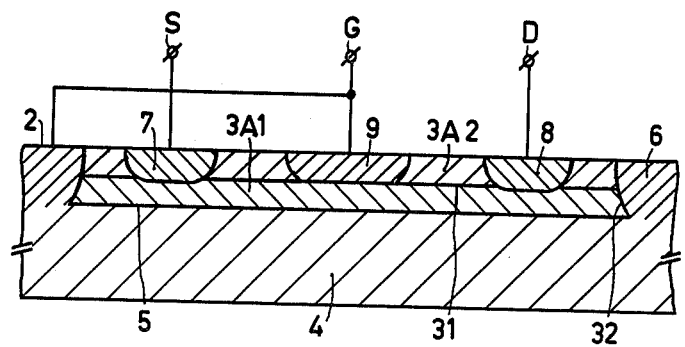
FIG. 3 is a diagrammatic cross-sectional view of another device according to the invention.

Still better results can be reached with a field effect transistor structure as shown diagrammatically in the sectional view of FIG. 3. This structure is substantially equivalent to that of FIG. 1, with the difference that the layer-shaped region 3A does not everywhere have the same conductivity type but comprises an n-type conductivity first layer portion 3A1 adjoining the p-type region 4, and an overlying p-type conductive second layer portion 3A2, which portions 3A1 and 3A2 form a p-n junction 31. The last layer portion 3A2 adjoins the surface 2. The layer portion 3A2 is connected to the substrate region 4 via the separation region 6 and thus is at substantially the same potential as said substrate region. The overall n-type net doping in atoms per cm$^2$ of the whole layer portion 3 A, that is to say of the combination 3A1 and 3A2, is so low that upon applying a voltage in the reverse direction across the p-n junction 5 the layer portions 3A1 and 3A2 of junction 5 are entirely depleted up to the surface 2 at a voltage which is lower than the breakdown voltage of p-n junction 5. The n-type layer portion 3A1 is depleted both from the p-n junction 5 and from the p-n junction 31, and laterally from the p-n junction 32 which connects the p-n junctions 31 and 5 together. The layer 3A2 is depleted only from the p-n junction 31; therefore, said layer portion 3A2 in itself also should have such a low p-type doping that it is fully depleted at a reverse voltage across the p-n junction (5, 32, 31) which is lower than the breakdown voltage.

Starting material in this field effect transistor was a substrate 4 having a p-type doping concentration of approximately $5.10^{14}$ atoms per cm$^3$. An n-type epitaxial layer having a thickness of approximately 5 $\mu$m and an average doping concentration of $9 \times 10^{15}$ atoms per cm$^3$ was deposited thereon. In this epitaxial layer a 3 $\mu$m deep n-type layer was formed by means of a boron implantation in a dose of $3.1 \times 10^{12}$ ions per cm$^2$. The thickness of layer portion 3A1 thus is approximately 2

μm and its overall n-type net doping (doping concentration in atoms per cm$^3$ multiplied by thickness d in cm) is approximately $1.8 \times 10^{12}$ atoms per cm$^2$. The thickness of the layer portion 3A2 is approximately 3 μm; its overall net p-type doping is $3.1 \times 10^{12} - 3 \times 10^{-4} \times 9 \times 10^{15} = 4 \times 10^{11}$ atoms per cm$^2$, its average net p-type doping concentration is $$\frac{3.1 \times 10^{12}}{3 \times 10^{-4}} - 9 \times 10^{15} = 1.3 \times 10^{15}$$

atoms per cm$^3$. The overall net n-type doping of the layer portions 3A1 and 3A2 together is $1.8 \times 10^{12} - 4 \times 10^{11} = 1.4 \times 10^{12}$ per cm$^2$, which is sufficiently low to satisfy the depletion conditions.

The n-type source and drain zones 7 and 8 and the p-type gate electrode zone 9 can be provided, for example, by diffusion or by ion implanation; the depth of penetration of the zones 7 and 8 must at any rate be at least equal to the thickness of the layer portion 3A2.

Since the second layer portion 3A2 has a conductivity type opposite to that of the first layer portion 3A1, so that upon determining the overall doping in donor atoms per cm$^2$ of the layer portion 3A(=3A1+3A2) the doping of the layer portion 3A2 is negative, and the first layer portion 3A1 is depleted from several sides, the average doping concentration of the first layer portion 3A1 may be higher than in the case in which the layer portions 3A1 and 3A2 would be of the same conductivity type. The characteristics of a field effect transistor of the type of FIG. 3 having the same pinch off voltage as the field effect transistors corresponding to the lines A and B of FIGS. 2, and with the same breakdown voltage and geometry is indicated in FIG. 2 by C. The saturation current in this case is 400 mA.

Figure 4:
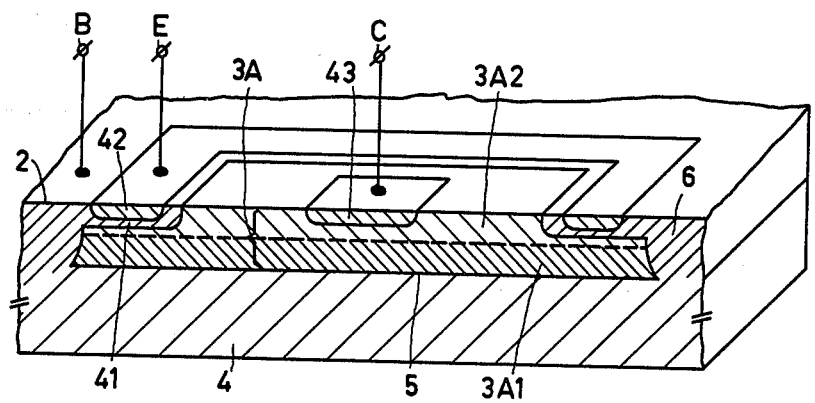
FIG. 4 is partly a perspective view and partly a cross-sectional view of a further device in accordance with the invention.

The invention is not restricted to field effect transistors, but may also be applied to bipolar semiconductor devices. FIG. 4, for example, shows a bipolar high voltage transistor having base, emitter and collector connections B, E and C. The collector zone is formed by the n-type conductive island-shaped, layer-shaped semiconductor region 3A which is situated on a lower doped p-type substrate region 4 and is enclosed by the p-type separation region 6. The p-type conductive base zone 41 is connected to the separation region 6. The n-type emitter zone 42 is provided in the base zone 41 and the n-type region 3A is contacted by means of a highly doped n-type collector contact zone 43. The overall net doping of the region 3A is so low that this region is fully depleted from the junction 5 up to the surface 2 at a reverse voltage across the p-n junction 5 which is lower than the breakdown voltage. Such a bipolar transistor in which the region 3A is homogeneously doped is described in the previously mentioned publication in Philips Journal of Research. Such a transistor has a high collector-base breakdown voltage which is determined substantially by the doping of the substrate region 4.

As a result of the comparatively low doping of the collector region required by the depletion condition, the resistance between the collector contact zone 43 and the collector region 3A below the base zone 41 via the part of the collector region adjoining the p-n junction 5 is rather high so that known transistors of this type have a comparatively low current-carrying capability. In addition, in circuit applications in which the n-type collector region 3A is at a high positive voltage relative to the p-type substrate region 4, for example in emitter follower circuits, the region 3A between the base zone 41 and the substrate 4 can become fully depleted from the p-n junction 5 (punch-through) before the region 3A between the base zone 41 and the collector contact zone 43 is depleted up to the surface 2, as a result of which the breakdown voltage is reduced.

According to the invention, the collector region 3A as in the example of FIG. 1 is built up from two layer portions 3A1 and 3A2 which are both n-type conductive but in which the current-carrying substrate-adjoining layer portion 3A1 has a higher average net doping concentration that the overlying layer portion 3A2. As a result of this the collector series resistance is reduced while the breakdown voltage remains substantially equally high as in a homogeneously-doped collector region 3A and the possibility of "punch-through" is also avoided. In accordance with the desired gain factor the required thicknesses and dopings can be chosen by those skilled in the art within the limits imposed by the invention.

Figure 5:
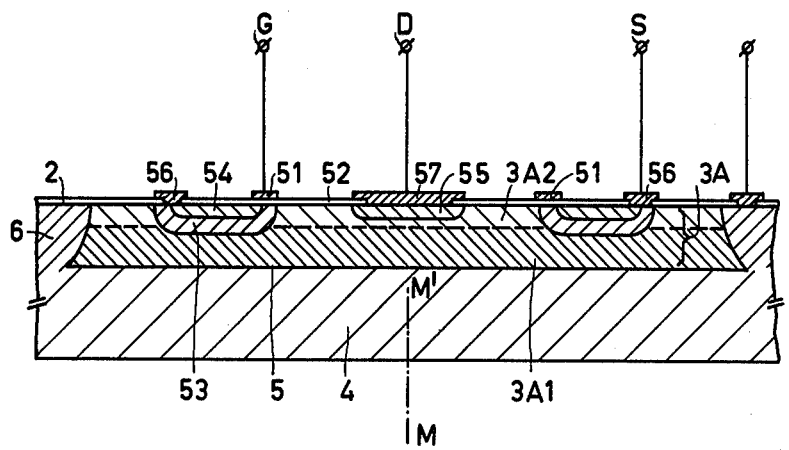
FIG. 5 is a diagrammatic cross-sectional view of a D-MOS transistor according to the invention.

In the examples of FIG. 1 and FIG. 4, the substrate region-adjoining layer portion 3A1 was more highly doped than the surface-adjoining layer portion 3A2, since the current-carrying layer portion here adjoined the substrate. This is not always the case. For example, in an insulated gate field effect transistor the current-carrying layer portion adjoins the surface. FIG. 5 is a diagrammatic cross-sectional view of such a field effect transistor of the D-MOST type which is constructed according to the RESURF principle, that is to say upon applying a voltage in the reverse direction across the p-n junction 5 the n-type conductive island-shaped region 3A is depleted up to the surface 2 prior to reaching the breakdown voltage of said junction. This device is symmetrical about the line MM'; between the gate electrode 51 and the semiconductor surface 2 a thin gate oxide layer 52 is present, the p-type channel region 53 and the n-type source zone 54 are diffused via the same window in the region 3A, and a highly doped n-type zone 55 is provided as a drain zone. The source zone 54 and the channel region 53 are short-circuited by means of a conductive layer 56, the drain zone 55 is contacted by means of a conductive layer 57.

In this device the current-carrying part of the region 3A is situated at the surface. Therefore, in this case according to the invention the region 3A comprises a first layer portion 3A1 and a second layer portion 3A2 which adjoins the surface 2 and which has a higher average net doping concentration than the layer portion 3A1 adjoining the substrate 4. It should be ensured that there, as well as in the preceding examples, the overall net doping of the region 3A in atoms per cm$^2$ is at most equal to the maximum value at which the condition is still met that depletion up to the surface occurs below the breakdown voltage of the p-n junction 5. For example, with an overall net doping of $10^{12}$ donor atoms per cm$^2$ for the whole region 3A, the layer portion 3A2 may have a thickness of 1 μm and an average doping concentration of $8 \times 10^{15}$ atoms per cm$^3$ (so overall doping $8 \times 10^{11}$ atoms per cm$^2$) and the layer portion 3A1 may have a thickness of 2 μm and an average doping concentration of $10^{15}$ atoms per cm$^3$ (overall doping $2 \times 10^{11}$ per cm$^2$). The layer portion 3A2 in which the current mainly flows thus has a considerably higher doping than if the region 3A were to be homogeneously doped (in which case its doping concentration would be $$\frac{10^{12}}{3 \times 10^{-4}} = 3.3 \times 10^{15}$$

atoms per cm$^3$).

Figure 6:
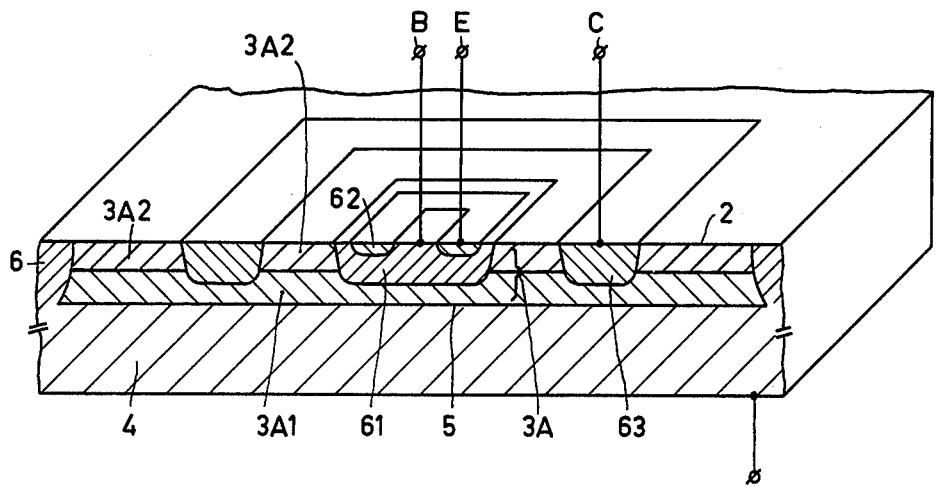
FIG. 6 is partly a perspective view and partly a cross-sectional view of a further device in accordance with the invention.

FIG. 6 is a cross-sectional view of a further embodiment of a device in accordance with the invention, namely a bipolar high voltage transistor of the RESURF type in which the layer-shaped region 3A is built up from layer portions of opposite conductivity types, an n-type layer portion 3A1 and a p-type layer portion 3A2. The transistor comprises a p-type base zone 61 and an n-type emitter zone 62. In this modified embodiment the second p-type layer portion 3A2 adjoining the surface 2 is interrupted locally, between the p-type separation region 6 and the base zone 61, by the collector zone 63 which extends through the layer portion 3A2 into the first layer portion 3A1. As in the example of FIG. 3, the n-type layer portion 3A1 below the p-type layer portion 3A2 may be comparatively highly doped while nevertheless the layer portions 3A1 and 3A2 together are depleted up to the surface 2 at a voltage across the p-n junction 5 which is lower than the breakdown voltage. As a result of this a high breakdown voltage of the p-n junction 5 and hence also of the collector-base junction can be obtained, since in the operating condition the base zone 61 usually is at substantially the same potential as the substrate 4, while nevertheless the collector series resistance is low due to the comparatively high doping concentration of the layer portion 3A1. In that example also the doping of the layer portion 3A2 must be sufficiently low to yield a total depletion of said layer portion at a voltage which is lower than the breakdown voltage. The transistor shown in FIG. 6 is also suitable for use in emitter follower circuits in which emitter and collector are both at a high voltage relative to the substrate region 4.

Figure 7:
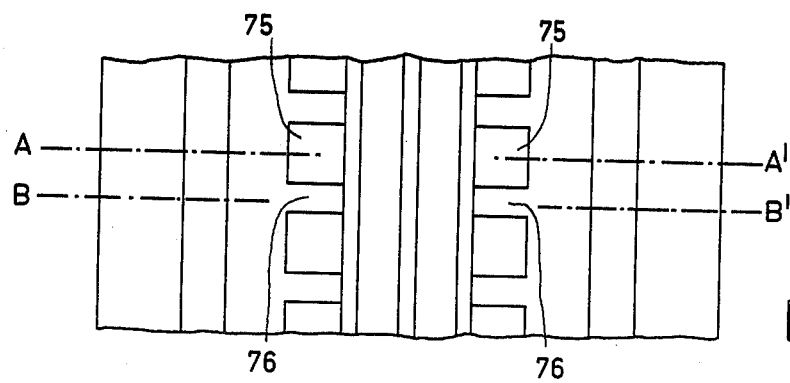
FIGS. 7 to 7B are a plan view and a cross-sectional view of a further D- MOS transistor according to the invention.
Figure 7A:
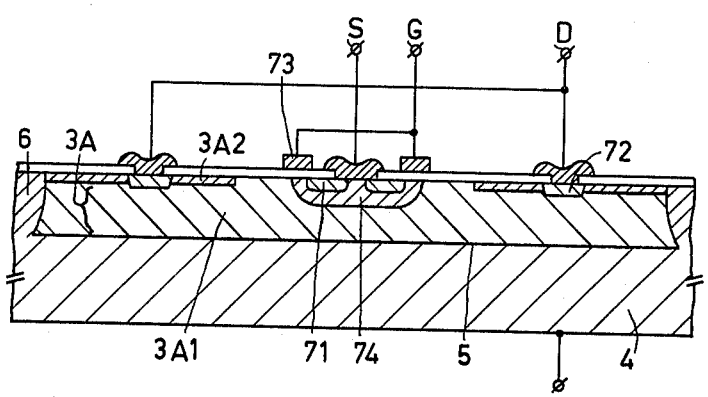
Figure 7B:
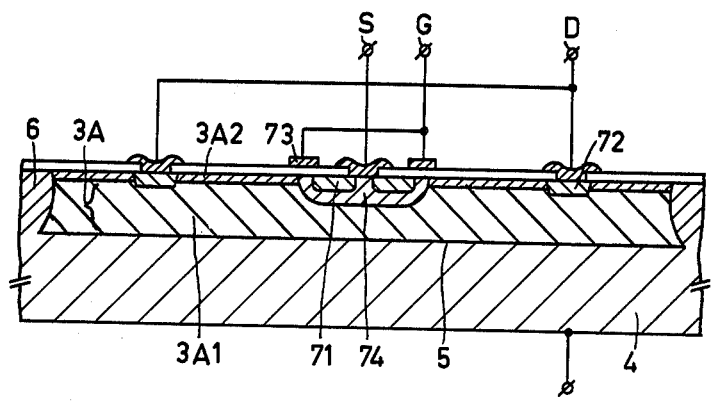

FIG. 7 is a plan view and FIGS. 7A and B are cross-sectional views of an insulated gate field effect transistor in which a layer-shaped semiconductor region 3A is used having a first n-type layer portion 3A1 present on a p-type substrate 4 and a superimposed surface-adjoining p-type layer portion 3A2, as in the examples of FIGS. 3 and 6. The device shown in FIG. 7 is a field effect transistor of the D-MOST type, as is the transistor of FIG. 5, having n-type source and drain zones 71 and 72 provided with connections S and D, a gate electrode 73 having a connection G and a p-type channel region 74. The dopings of the p-type layer portion 3A2 and of the n-type layer portion 3A1 according to the invention must satisfy the same conditions as in the examples shown in FIGS. 3 and 6. The p-type layer portion 3A2 in this case may not everywhere continue up to the channel region 74 since then the field effect transistor would not operate since no current channel can be formed in the parts of layer 3A2 situated outside the gate electrode. The layer portion 3A2 therefore in most places does not extend up to the channel region 74 but it is interrupted in that beside the region 74 the first layer portion 3A1 extends up to the surface. In the plan view of FIG. 7 it is shown that apertures 75 are provided for that purpose in the layer 3A2. Between the apertures the layer 3A2 remains connected to the region 74 via bridges 76 so that the layer portion 3A2 is not floating (which generally would be unfavorable). FIG. 7A is a cross-sectional view taken on the line AA' of FIG. 7; in these places the D-MOST is operative. FIG. 7B is a cross-sectional view taken on the line BB'; in these places no current flows from S to D and the D-MOST is not operative. Furthermore the doping profile of FIG. 7 has the same advantages as that of the examples of FIGS. 3 and 6; by bilateral depletion of the layer portion 3A1 between the regions 3A2 and 4 the doping of said layer portion 3A1 may be comparatively high and the series resistance may be correspondingly low. This D-MOST may also be used in emitter follower circuits.

Figure 8:
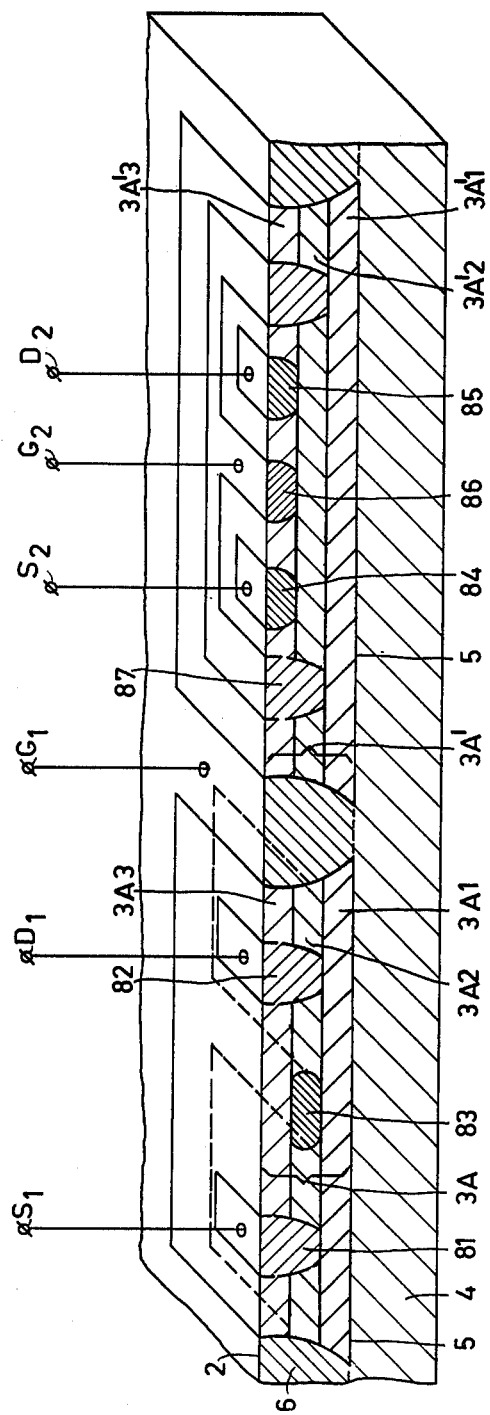
FIG. 8 is a diagrammatic cross-sectional view of an integrated circuit having complementary JFETs according to the invention.

FIG. 8 is a cross-sectional view of a device having a layer-shaped region 3A with more than two successive layer portions of alternate conductivity types. As shown in FIG. 8, for example, an integrated circuit with complementary junction field effect transistors can be realized herewith.

A JFET having an n-type channel region 3A1 and n$^{30}$ source and drain zones 81 and 82 (connections S$_1$ and D$_1$), as well as a p$^{30}$ gate electrode zones 83 are present on the left-hand side. The island-shaped portion 3A of the layer-shaped semiconductor region bounded laterally by the p$^{30}$ separation diffusion 6 is built up from a first n-type layer portion 3A1, a second p-type layer portion 3A2, and a third n-type layer portion 3A3. The region 3A again has such a net doping in atoms per cm$^2$ that it is fully depleted from the p-type substrate 4 up to the surface 2 prior to reaching the breakdown voltage of the p-n junction 5. For that purpose it is also ensured that the last surface-adjoining layer portion 3A3 in itself has such a low doping that it can be depleted from the second layer portion 3A2 up to the surface prior to breakdown of the p-n junction 5. The gate electrode zone 83, as shown in broken lines in the Figure, is connected within the semiconductor body and within the layer portion 3A2 to the p type separation region 6 and contacted via this region (connection G$_1$).

A corresponding layer-shaped semiconductor region 3A', built up from layer portions 3A'1, 3A'2 and 3A'3 which form part of the same semiconductor layers as the layer portions 3A1, 3A2 and 3A3, is present on the right-hand side. The dopings of said layer portions also satisfy the same conditions. In the manner shown in the Figure, a complementary JFET having p$^+$ source and drain zones 84 and 85 (connections S$_2$ and D$_2$), an n$^{30}$ gate electrode zone 86 (connection G$_2$), and a p-type channel region 3A'2 are provided in the island-shaped region 3A'. The n-type channel portions 3A'3 and 3A'1 are connected together via an annular n-type zone 87. In this manner two complementary junction field effect transistors, both suitable for high voltage, are obtained in the same semiconductor body. Since the n-type layer portions are connected to the same potential via the zones 81 and 87 and the p-type layer portions are connected to the same potential via the zones 6, the layer portions 3A1 and 3A2, as well as the layer portions 3A'1 and 3A'2, are depleted from two sides in a vertical direction; the layer portions 3A3 and 3A'3 only from below. Depletion also occurs at the edges of all layer portions from the separation regions 6.

Figure 9:
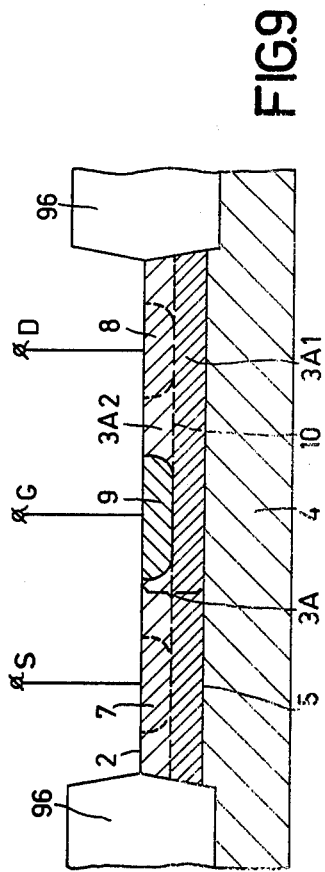
FIG. 9 is a modified embodiment of the device shown in FIG. 1.

In the examples described the separation region 6 always comprises of a semiconductor zone. However, it is also possible instead to use a separation region which is formed by an insulating material. FIG. 9, for example, shows a modified embodiment which in every other respect is equal to the example of FIG. 1 but in which the separation region 96 is formed by a (partly) countersunk pattern of silicon oxide. The region 96 may in certain circumstances also be omitted entirely; in that case the separation region is formed by a groove and a mesa structure is obtained.

The conditions which the dimensions and the net doping concentration of the layer-shaped region 3A must satisfy in order that this region be fully depleted well before the occurrence of breakdown (the so-called "RESURF" conditions) are described in the abovementioned Dutch Patent Applications and in the abovementioned publication in Philips Journal of Research. They come down to that the product of the net doping concentration in atoms per cm$^3$ and the thickness d in cm of said region 3A must be below a given limit. This limit depends inter alia on the doping of the substrate region 4. For silicon it holds that with the usual substrate dopings of at least $10^{14}$ atoms per cm$^3$ and at most $10^{15}$ atoms per cm$^3$ the overall net doping $N \times d$ of the layer-shaped region 3A should be approximately $10^{12}$ atoms per cm$^2$ and preferably at least equal to $8 \times 10^{11}$ atoms per cm$^2$ and at most equal to $1.5 \times 10^{12}$ atoms per cm$^2$.

The invention is not restricted to the examples described. For example, instead of silicon, any other suitable semiconductor material, for example germanium or gallium arsenide, may also be used. Furthermore, in each example the conductivity types of all semiconductor regions may (simultaneously) be replaced by their opposite types. The invention may be applied to all semiconductor devices of the "RESURF" type provided the said conditions regarding the doping of the various layer portions are satisfied. In all the examples the electric connections need not be as shown in the drawing. For example, in the device of FIG. 1 the gate electrode zone 9 may alternatively be separated electrically from the substrate 4. The substrate regions of the devices, in as far as they are not used as (second) gate electrodes, may be connected to ground, if desired, or to any other reference potential. Many variations are possible to those skilled in the art without departing from the scope of this invention.

What is claimed is:

1. A semiconductor device having a semiconductor body comprising a substrate region of a first conductivity type, a surface-adjoining layer-shaped semiconductor region provided at the surface of said substrate region, at least a substrate region-adjoining part of said layer-shaped semiconductor region being of a second conductivity type opposite to that of said first type and forming a p-n junction with said substrate region, an island-shaped part of said layer-shaped semiconductor region being bounded laterally by a separation region which extends from the surface over substantially the whole thickness of the semiconductor region, at least a first zone of a semiconductor circuit element being provided within said island-shaped part, the overall net doping of the second conductivity type of said layer-shaped semiconductor region in atoms per unit of surface area being sufficiently small such that when a voltage in the reverse direction is applied across said p-n junction the depletion zone within the island-shaped part will extend at least locally from said p-n junction up to the surface at a voltage which is lower than the breakdown voltage of the p-n junction, at least a part of said island-shaped part of the layer-shaped semiconductor region having a doping profile comprising at least two overlying layer portions of different average net doping concentrations between said substrate and said surface.

2. A semiconductor device as claimed in claim 1, characterized in that at least the substrate region-adjoining part of the layer-shaped semiconductor region is more highly doped than the substrate region.

3. A semiconductor device as claimed in claim 1 or 2, characterized in that said layer portions with different net doping concentrations extend up to the edge of the island-shaped region.

4. A semiconductor device as claimed in claim 1 or 2, characterized in that the layer-shaped semiconductor region is entirely of the second conductivity type.

5. A semiconductor device as claimed in claim 4, characterized in that the layer portion having the highest average doping concentration adjoins the substrate region.

6. A semiconductor device as claimed in claim 5, characterized in that the layer portion having the highest average doping concentration is formed by a layer of the second conductivity type implanted in the substrate.

7. A semiconductor device as claimed in claim 4, characterized in that the layer portion having the highest average doping concentration adjoins the surface.

8. A semiconductor device as claimed in claims 1 or 2, characterized in that the layer-shaped semiconductor region comprises at least a first layer portion of the second conductivity type adjoining the substrate region and at least a second layer portion of the first conductivity type provided thereon, the last, surface-adjoining layer portion having a sufficiently low doping level to be fully depleted at a voltage across said p-n junction which is lower than the breakdown voltage, the layer portion of the first conductivity type being connected to a potential which is substantially equal to the potential of the substrate region.

9. A semiconductor device as claimed in claim 8, characterized in that the layer portion of the first conductivity type are connected to the substrate region by means of semiconductor zones of the first conductivity type.

10. A semiconductor device as claimed in claim 8, characterized in that the layer-shaped semiconductor region consists of a number of successive layers of alternate conductivity types, in which the layer portions of the second conductivity type are mutually connected to substantially the same potential.

11. A semiconductor device as claimed in claim 8, characterized in that the second layer portions adjoin the surface.

12. A semiconductor device as claimed in claim 11, characterized in that the second layer portion is non-continuous.

13. A semiconductor device as claimed in claim 1 or 2, characterized in that at least one of the said layer portions is formed by an epitaxially grown layer.

14. A semiconductor device as claimed in claim 1 or 2, characterized in that the separation region is formed by a semiconductor zone of the first conductivity type.

15. A semiconductor device as claimed in claims 1 or 2, characterized in that the separation region is formed by a pattern of electrically insulating material at least partly countersunk in the semiconductor body.

16. A semiconductor device as claimed in claim 1 or 2, characterized in that the substrate region has a doping concentration of at least $10^{14}$ atoms per cm$^3$ and at most $10^{15}$ atoms per cm$^3$ and that the overall net doping of the layer-shaped semiconductor region is at least $8 \times 10^{11}$ atoms per cm$^2$ and at most $1.5 \times 10^{12}$ atoms per cm$^2$.

17. A semiconductor device as claimed in claim 1 or 2, characterized in that the layer-shaped region forms the channel region of a junction field effect transistor (JFET), said JFET having surface-adjoining, spaced-apart source, gate, and drain regions.

18. A semiconductor device as claimed in claim 1 or 2, further comprising a lateral self-aligned insulated gate field effect transistor and characterized in that the layer-shaped region adjoins the drain zone and the channel region of said lateral self-aligned insulated gate field effect transistor.

19. A semiconductor device as claimed in claim 1 or 2, characterized in that a part of the layer-shaped region froms the collector zone of a bipolar transistor, said transistor having surface-adjoining, adjacent base and emitter zones.

20. A semiconductor device as claimed in claims 1 or 2, characterized in that the layer-shaped semiconductor region comprises at least a first layer portion of the second conductivity type adjoining the substrate region and at least a second layer portion of the first conductivity type provided thereon, the layer portions of the first conductivity type being connected to a potential which is substantially equal to the potential of the substrate region, and means for causing the top surface-adjoining layer portion to be fully depleted at a voltage across said p-n junction which is lower than the breakdown voltage.

21. A semiconductor device as claimed in claim 20, characterized in that said means comprises a sufficiently low doping concentration of said layer portion.

* * * * *

UNITED STATES PATENT AND TRADEMARK OFFICE
CERTIFICATE OF CORRECTION

PATENT NO. : 4,422,089
DATED : December 20, 1983
INVENTOR(S) : HENRICUS M.J. VAES ET AL It is certified that error appears in the above—identified patent and that said Letters Patent is hereby corrected as shown below:

Column 13, Claim 19, line 3, "froms" should be --forms--

Signed and Sealed this

Fourteenth Day of August 1984

[SEAL]

Attest:

GERALD J. MOSSINGHOFF

Attesting Officer   Commissioner of Patents and Trademarks